United States Patent [19]

Ohms

[11] Patent Number: 4,684,827
[45] Date of Patent: Aug. 4, 1987

[54] CIRCUIT ARRANGEMENT FOR DETECTING A CURRENT IN POWER SUPPLY DEVICES

[75] Inventor: Franz Ohms, Weissach im Tal, Fed. Rep. of Germany

[73] Assignee: ANT Nachrichtentechnik GmbH, Backnang, Fed. Rep. of Germany

[21] Appl. No.: 838,200

[22] Filed: Mar. 7, 1986

Related U.S. Application Data

[63] Continuation of Ser. No. 626,998, Jun. 29, 1984, abandoned.

[30] Foreign Application Priority Data

Jul. 2, 1983 [DE] Fed. Rep. of Germany ....... 3323905

[51] Int. Cl.⁴ ............................................... G01R 1/20
[52] U.S. Cl. .................................... 307/413; 307/131; 323/344; 324/127
[58] Field of Search ........................ 307/116, 131, 413; 323/299, 259, 282, 344, 345; 324/127

[56] References Cited

U.S. PATENT DOCUMENTS

| | | | |
|---|---|---|---|
| 2,773,234 | 12/1956 | Large | 323/344 |
| 3,733,536 | 5/1973 | Gillow et al. | 324/127 X |
| 3,768,012 | 10/1973 | Wilkinson | 324/127 |
| 3,815,011 | 6/1974 | Milkovic | 324/127 X |
| 3,815,012 | 6/1974 | Milkovic | 324/127 X |
| 3,815,013 | 6/1974 | Milkovic | 324/127 X |
| 3,916,310 | 10/1975 | Stark et al. | 324/127 |
| 3,996,513 | 12/1976 | Butler | 324/127 X |
| 4,182,982 | 1/1980 | Wolf et al. | 324/127 |
| 4,198,595 | 4/1980 | Milkovic | 324/127 X |
| 4,213,083 | 7/1980 | Freygang | 324/127 X |
| 4,286,214 | 8/1981 | Milkovic | 324/127 X |
| 4,298,838 | 11/1981 | Akamatsu et al. | 324/127 X |
| 4,354,155 | 10/1982 | Speidel et al. | 324/127 X |
| 4,442,339 | 4/1984 | Mizuno et al. | 323/285 X |
| 4,492,919 | 1/1985 | Milkovic | 324/127 |
| 4,538,101 | 8/1985 | Shimpo et al. | 363/86 X |

FOREIGN PATENT DOCUMENTS 2339856 2/1975 Fed. Rep. of Germany.
2822897 11/1979 Fed. Rep. of Germany.
2938533 3/1981 Fed. Rep. of Germany.

Primary Examiner—William M. Shoop, Jr.
Assistant Examiner—Shik Luen Paul Ip
Attorney, Agent, or Firm—Spencer & Frank

[57] ABSTRACT

A circuit arrangement for detecting a current flowing over a path in a power supply device, which arrangement includes a choke having a primary winding and a measuring winding, with each winding having first and second ends and the choke being connected so that the current to be detected flows through the primary winding, and a comparison stage having first and second inputs, with one of the comparison stage inputs being connected to the measuring winding. The primary and measuring windings have substantially identical temperature coefficients of resistance and have an effective turns ratio of 1:1 with respect to alternating voltage transformation, the primary winding has its first end connected to be supplied with the current to be detected and its second end connected to the first end of the measuring winding, the first input of the comparison stage is connected to the second end of the measuring winding, and the second input of the comparison stage is connected to a point in the current flow path in the vicinity of the choke.

4 Claims, 6 Drawing Figures

CIRCUIT ARRANGEMENT FOR DETECTING A CURRENT IN POWER SUPPLY DEVICES

This application is a continuation, of application Ser. No. 626,998, filed June 29, 1984, now abandoned.

BACKGROUND OF THE INVENTION

The present invention relates to a circuit arrangement for detecting a current in power supply devices.

In order to detect currents in power supply devices, it is customary to evaluate the voltage drop across an ohmic resistor as a result of current flow. Such current detection is disclosed, for example, in DE-OS No. [Federal Republic of Germany - Laid-Open Application] 2,822,897, particular reference being made to FIG. 3 thereof. Such a current shunt is very expensive, particularly for the detection of high current levels. The additional installation of such a current shunt reduces the efficiency of the power supply device. It is also conceivable to detect a current by means of Hall effect elements. However, this type of evaluation involves problems with respect to offset voltages and a tendency toward drifting.

SUMMARY OF THE INVENTION

It is therefore an object of the present invention to provide a circuit arrangement for detecting a current in power supply devices which can be realized at minimum expense and in a manner which does not create additional power losses.

The above and other objects are achieved, according to the invention, by constructing a circuit arrangement for detecting a current flowing over a path in a power supply device, which arrangement includes a choke having a primary winding and a measuring winding, with each winding having first and second ends and the choke being connected so that the current to be detected flows through the primary winding, and a comparison stage having first and second inputs, with one of the comparison stage inputs being connected to the measuring winding, so that the primary and measuring windings have substantially identical temperature coefficients of resistance and have an effective turns ratio of 1:1 with respect to alternating voltage transformation, the primary winding has its first end connected to be supplied with the current to be detected and its second end connected to the first end of the measuring winding, the first input of the comparison stage is connected to the second end of the measuring winding, and the second input of the comparison stage is connected to a point in the current flow path in the vicinity of the choke.

Additional features of the circuit arrangement according to the invention will be described below.

Although it is known, for example from DE-OS No. 2,938,533, to use a current transformer to evaluate a current in power supply devices, this publication does not provide any suggestion regarding the detection of the direct current level by compensation of the magnetic voltage of the primary winding by means of the transformed voltage.

The advantage of the circuit arrangement according to the present invention is, in particular, the fact that no additional shunt resistor is needed. The input filter choke, which is provided in any case, can be used for the current detection. Its copper resistor is used as the measuring sensor. The measuring winding simultaneously meets the following requirements: the magnetically induced voltage of the primary winding and the temperature curve of the winding resistance in the primary winding are compensated.

The present invention will now be explained in greater detail with reference to the drawing.

DESCRIPTION OF THE PREFERRED EMBODIMENTS

Figure 1:
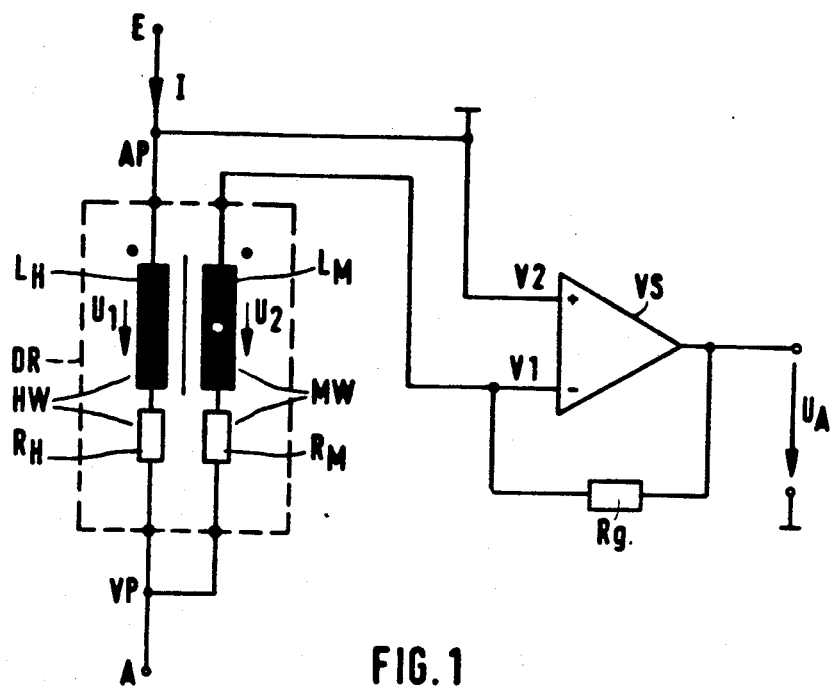
FIG. 1 is a circuit diagram of a basic circuit arrangement according to the present invention.

In FIG. 1, a current I to be detected flows between an input terminal E and an output terminal A of the primary winding HW of a choke DR. The primary winding HW is shown in FIG. 1 by the series equivalent circuit composed of a purely ohmic winding resistor $R_H$ and a pure inductance $L_H$. The end, or output side, of primary winding HW is connected at a point VP with the beginning, or input side, of measuring winding MW—likewise shown by a series equivalent circuit comprised of a purely ohmic winding resistor $R_M$ and a pure inductance $L_M$—represented as connection point VP. The sense of the winding turns on the primary winding HW and the measuring winding MW has been selected in such a manner that the vectors of both voltages $U_1$ and $U_2$ across inductances $L_H$ and $L_M$ point toward the common connection point VP. The relative polarities of the two windings are indicated in a conventional manner by dot marks.

With respect to the alternating voltage transformation, the primary winding HW and the magnetically coupled measuring winding MW have the same number of winding turns; i.e. the number of winding turns with respect to the turns around the choke core is the same, although the ohmic winding resistors $R_H$ and $R_M$ may differ from one another by the factor $10^4$.

Since the same temperature curve is required for the primary winding HW and for the measuring winding MW, the windings must be of identical material, or have the same relative temperature coefficient of resistance $k \cdot \theta$.

The values for winding resistances $R_H$ and $R_M$ are as follows:

$$R_H = 3 m\Omega$$

and $$R_M = 10 \, \Omega.$$

This large difference in these resistances is provided because $R_H$ must be as low as possible, to reduce the power consumption in the circuit between terminal E and A. $R_M$ ought to be high to produce a sufficient output voltage $U_A$, while feedback current through feedback resistor Rg has to be small in order to provide an economically driven operational amplifier VS.

The voltages U1 across inductance $L_H$ of primary winding HW and U2 across inductance $L_M$ of measuring winding MW both cancel, because their alternating voltage transformation behaviour is the same (same effective windings for alternating voltage) and their series connected windings have opposite sense of winding.

The end, or output side, of measuring winding MW is connected to the inverting input V1 of comparison stage VS which is constructed as an operational amplifier. The non-inverting input V2 of VS is connected to a tap AP in the circuit of current I. AP is preferably applied to the beginning or the end of HW so that no additional voltage drop occurs in the leads which would make the compensation ineffective. Operational amplifier VS is feedback connected through a resistor Rg. At the output of the operational amplifier, there is available an output voltage $U_A$ for further processing or serving as an indication criterion. As shown by the calculation below, $U_A$ is a function only of the current I to be detected, the purely ohmic winding resistors and the feedback resistor Rg. The selected circuit arrangement does not produce a temperature dependence. Node analysis provides:

$$U_A = -\frac{R_g}{R_{M(\theta)}} \cdot (-I \cdot R_{H(\theta)}) \quad (1)$$

where $R_{H(\theta)}$ and $R_{M(\theta)}$ are the winding resistances of the primary winding and measuring winding which are a function of temperature.

The following dependencies exist for $R_{H(\theta)}$ and $R_{M(\theta)}$:

$$R_{H(\theta)} = R_{Ho}[1 + k\theta_{cu} \cdot (T - T_o)] \quad (2)$$

and $$R_{M(\theta)} = R_{Mo}[1 + k\theta_{cu} \cdot (T - T_o)] \quad (3)$$

where $R_{Ho}$ is the winding resistance of the primary winding at a reference temperature $T_o$ and $R_{Mo}$ is the winding resistance of the measuring winding likewise at reference temperature $T_o$ and $k\theta_{cu}$ is the relative temperature coefficient of resistance of copper winding material.

If these dependencies are inserted into the formula obtained from the node analysis, the following results:

$$U_A = Rg \cdot I \cdot \frac{R_{Ho}[1 + k\theta_{cu} \cdot (T - T_o)]}{R_{Mo}[1 + k\theta_{cu} \cdot (T - T_o)]} \quad (4)$$

Therefore:

$$U_A = Rg \cdot I \cdot \frac{R_{Ho}}{R_{Mo}} \neq f(\theta) \quad (5)$$

$U_A \neq f(\theta)$ means that $U_A$ is indeed no function of temperature $\theta$.

The circuit arrangement thus behaves like a purely ohmic shunt resistor, with the winding resistance $R_H$ of the primary winding, which is provided in any case, being utilized for the current detection. In other words, the input signal to amplifier VS corresponds to the voltage produced across primary winding HW by the current to be detected. As equations (1), (4) and (5) establish feedback resistor Rg and windings HW and MW are connected so that the temperature dependency of the winding resistance $R_M$ of measuring winding MW compensates the temperature dependence of the winding resistance $R_H$ of primary winding HW.

Figure 2:
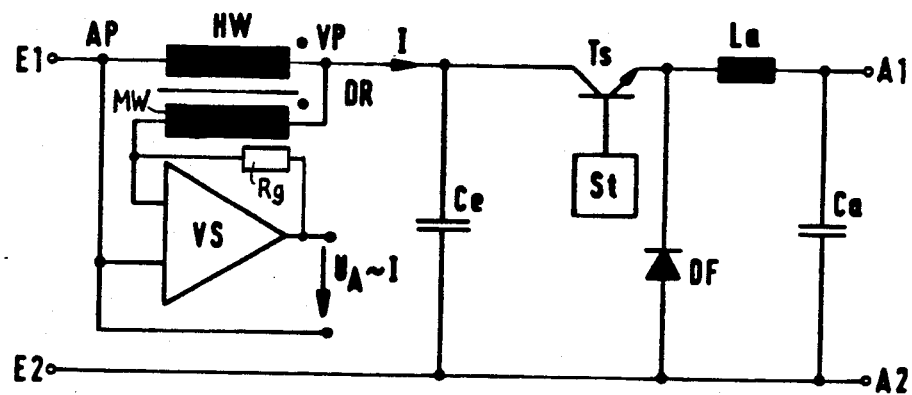
FIG. 2 is a circuit diagram of a buck regulator including an input current detection circuit according to the invention.

FIG. 2 shows the use of the circuit arrangement for a buck, or switching regulator. E1 and E2 are the input terminals and A1 and A2 are the output terminals of the regulator. The primary winding HW of the input filter choke DR is connected in series between input terminal E1 and a switching transistor Ts. The input filter choke DR is provided with measuring winding MW, which is connected in the same manner as in FIG. 1. La und Ca are, respectively, inductive and capacitive filter means at the output end and capacitor Ce acts together with primary winding HW as the filter means at the input end. The resistance provided by the copper material of input filter choke DR is utilized as the measuring sensor for the current I to be detected in the regulator. In the circuit of FIG. 2 amplifier VS will be provided, as shown in FIG. 1, with a feedback resistor Rg, too.

Figure 3:
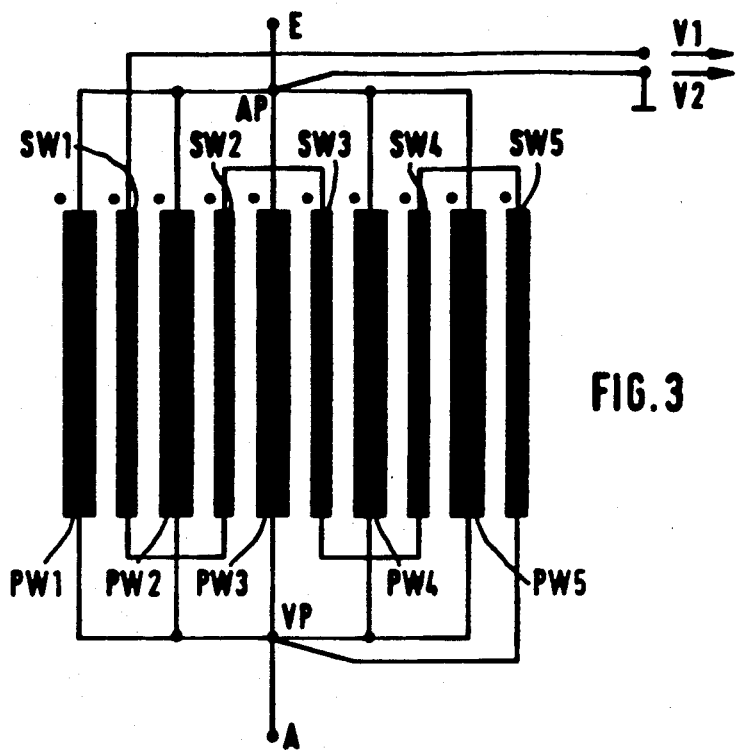
FIG. 3 is a circuit diagram of a choke embodiment of the invention in which partial windings are connected together.

FIG. 3 shows a special embodiment of choke DR. In this embodiment, the primary winding HW is composed of five parallel connected partial primary windings PW1 to PW5 and measuring winding MW is composed of five partial secondary windings SW1 to SW5 which are connected in series with adjacent partial secondary windings being in phase opposition. The only alternating voltage is a winding voltage, which is connected in phase opposition to the alternating voltage of the primary winding in the measuring winding branch so that both cancel one another out. A prerequisite for compensation is that all windings have the same temperature dependence. Due to the connection of winding ends of the parallel arrangement and the series arrangement causing specific senses for the windings, alternative voltage across SW1 compensates alternative voltage across SW2, alternative voltage across SW3 compensates alternative voltage across SW4, and alternative voltage across SW5 is compensated by all of the parallel arrangement windings PW1 to PW4. Direct voltages, caused by ohmic voltage drops of the windings are added. The embodiment of FIG. 3 enables that winding resistance $R_H$ is very low, whereas winding resistance $R_M$ is sufficiently high. The diameters of primary and secondary windings may differ by e.g. 10:1.

Figure 4:
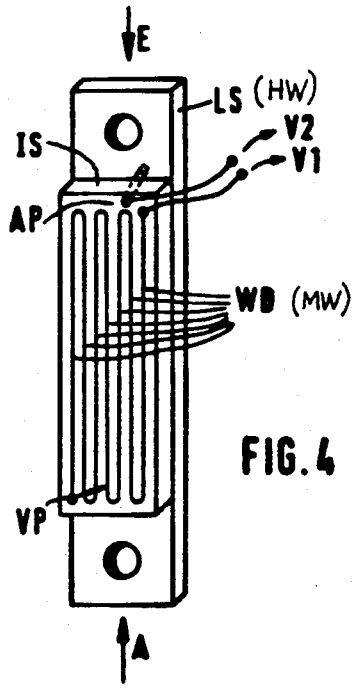
FIG. 4 is a perspective view of windings for a choke in which the measuring winding has a meander shape.
Figure 6:
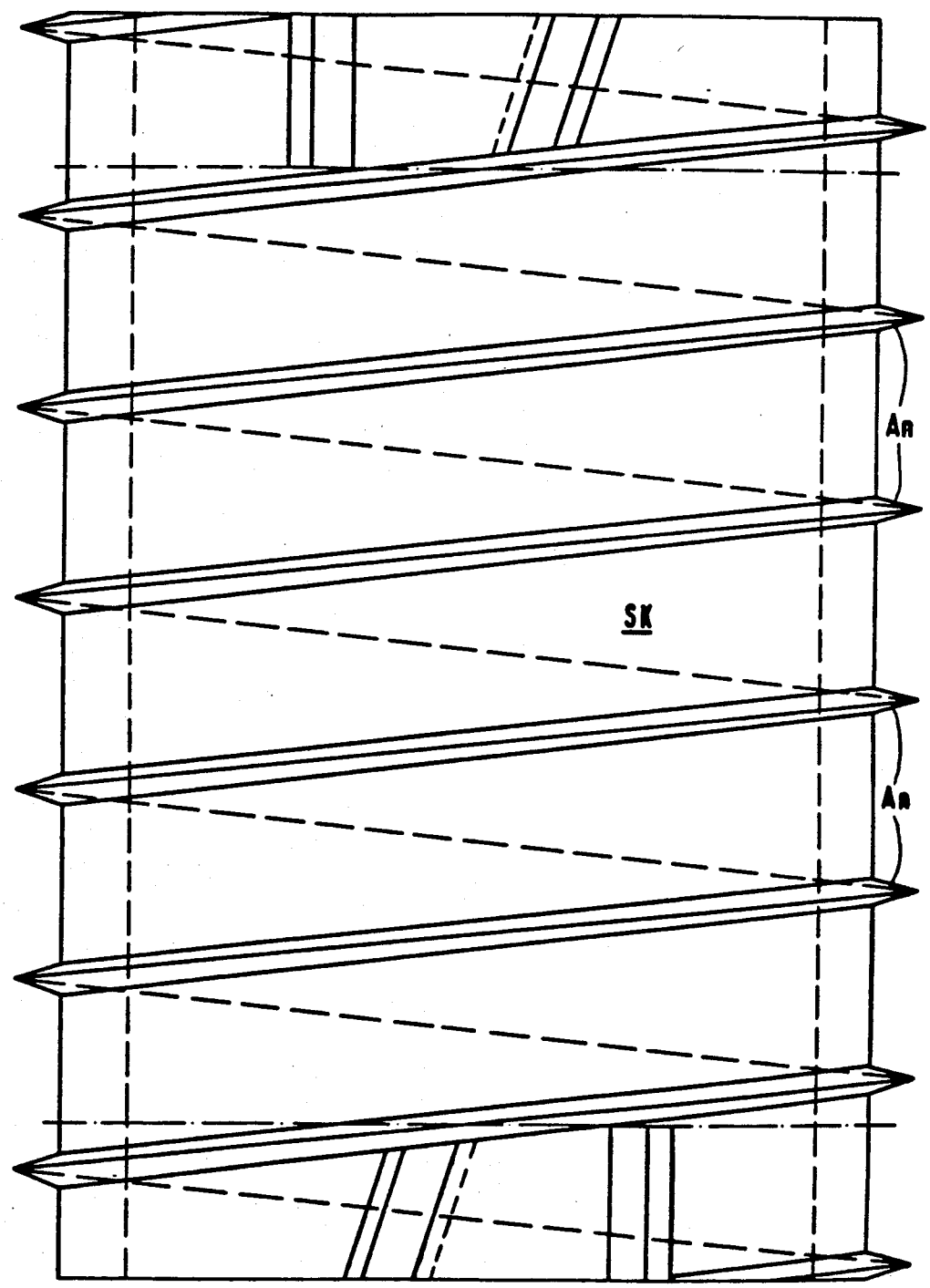
FIG. 6 is an elevational view of a coil body used in embodiments of the invention.

A further embodiment of choke DR is shown in FIG. 4. Here, primary winding HW is composed of a flat conductor strip LS, onto which an insulation layer IS is applied. Winding wires WD for the measuring winding MW are glued onto insulation layer IS next to one another in a meander pattern. Conductor strip LS has connecting points at its ends. Connecting point VP between primary winding and measuring winding is produced by soldering the beginning, or input end, of MW to conductor strip LS from which it is otherwise separated by the insulation IS. Conductor strip LS is wound onto a choke core, or coil body, one example of which is shown in FIG. 6, together with the meander-shaped winding wires WD. The illustration in FIG. 4 is not to scale; in practice, strip LS and wires WD will be longer than shown.

Figure 5:
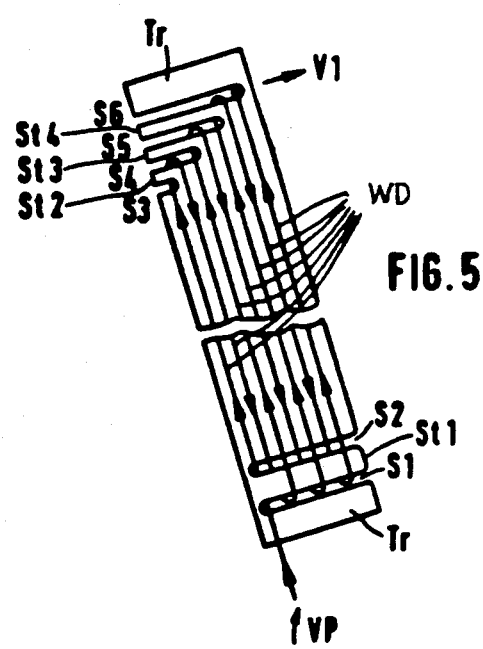
FIG. 5 is a pictorial view of a winding scheme for a modified measuring winding.

FIG. 5 shows the winding scheme for measuring winding MW for a modified choke. Winding wires WD of measuring winding MW are applied to a carrier body Tr provided with slits S1 through S6 defining bars St1 to St4 at the input side associated with connecting point VP and at the output side associated with comparison stage input V1 for the passage of the winding wires WD. The input side of the wire is initially guided underneath a bar St1 formed by the two slits S1 and S2 and extends parallel to the longitudinal extent of carrier body Tr and the surface of the latter until it reaches slits S3 and S4 in the region of the output side of the winding. There, the wire is guided from below around bar St2 formed by slits S3 and S4. Now the wire extends in parallel to the first wire length likewise on the surface of the carrier body back to bar St1, goes around the latter and on to bar St3, etc. until it finally reaches the output side of the measuring winding. Thereafter, measuring winding MW is glued to the conductor strip LW of primary winding HW, via insulation strip IS, as shown in FIG. 4.

Winding wires WD should have same lengths. Minor differences in length, due to guiding the wires around different bars St 2 to St 4 can be neglected.

FIG. 6 shows a cylindrical coil body SK provided on its outer surface with a single-turn, helical projection An which goes around the longitudinal axis of the cylinder and has a rectangular, triangular or trapezoidal cross section. The space between two adjacent turns of projection An—i.e. the height of each turn—as it would be called in a screw—is available as the winding area for the assembly of measuring winding MW which is arranged in a back and forth pattern as shown in FIG. 5 and the primary winding HW glued thereonto. In the embodiment of FIG. 6, cylindrical coil body SK has slits at the ends of its winding area similar to the embodiment of FIG. 5. Between these slits wire is guided around the remaining bars as described in accordance with the embodiment of FIG. 5 (slits in carrier body Tr). Instead of the slits in carrier body SK, coil body SK may be provided with button-like circular raised portions (not shown) in the ends of the helical winding area, with the winding wire of the measuring winding MW being wound therearound at the points of reversal for the back and forth windings, analogously to winding of the wire around the bars St of FIG. 5.

In the embodiment of FIG. 1 input V2 of operational amplifier is connected to the AP end of winding HW and input V1 to the end of winding HW apart from VP. Another embodiment provides connections of non inverting input V1 to the VP end of winding HW and of inverting input V2 to the end of winding MW apart from AP. Different from the embodiment according to FIG. 1, which has an operational amplifier of the inverting type, this last mentioned embodiment has an operational amplifier of the non inverting type.

The embodiments of FIGS. 5 and 6 have more than one slit as well as bars, enabling all windings to be wound around separate bars and thus avoiding crossings for the windings. As normally the winding coils are isolated and the crossings have no disadvantageous influence on the circuit performance, a further embodiment of the invention provides only two slits at the V1 end of winding wires WD, thus producing only one bar around which all winding wires WD are guided.

It will be understood that the above description of the present invention is susceptible to various modifications, changes and adaptations, and the same are intended to be comprehended within the meaning and range of equivalents of the appended claims.

What is claimed is:

1. In a circuit arrangement for detecting a current flowing over a path in a power supply device, which arrangement includes a choke having a primary winding and a measuring winding each having a winding resistance, with each winding having first and second ends and the choke being connected so that the current to be detected flows through the primary winding, an amplifier having first and second inputs and an output, with one of the amplifier inputs being connected to the measuring winding, the primary and measuring windings having substantially identical temperature coefficients of resistance and an effective turns ratio of 1:1 with respect to alternating voltage transformation, the primary winding having its first end connected to be supplied with the current to be detected and its second end connected to the first end of the measuring winding, the first input of the amplifier being connected to the second end of the measuring winding, and the second input of the amplifier being connected to a point in the current flow path in the vicinity of the choke the improvement wherein: said amplifier inputs are connected to said primary winding and measuring winding of said choke in such a manner that said amplifier receives an input signal corresponding to the voltage produced across said primary winding by the current to be detected; and said circuit arrangement further comprises a feedback resistance connected between said output and said first input of said amplifier, said resistance and said primary and measuring windings being connected for causing the temperature dependency of the winding resistance of said measuring winding to compensate the temperature dependency of the winding resistance of said primary winding in such a manner that the voltage at the output of said amplifier is proportional to the current to be detected and is independent of variations in the temperature of said choke.

2. Circuit arrangement as defined in claim 1, wherein said impedance is selected for producing a high feedback level.

3. Circuit arrangement as defined in claim 1 wherein said primary winding comprises a plurality of parallel connected partial primary windings, and said measuring winding comprises a plurality of partial measuring windings which are series connected in a manner such that each partial measuring winding is connected in phase opposition to an adjacent one of said partial measuring windings.

4. Circuit arrangement as defined in claim 1, wherein said primary winding comprises an elongate flat conductor strip, said choke further comprises an insulation body applied to at least one side of said conductor strip, and said measuring winding is applied on said insulation body in a meander pattern composed of parallel segments spaced apart in a direction perpendicular to the longitudinal direction of said flat conductor strip.

* * * * *